US008598969B1

(12) United States Patent
Walker et al.

(10) Patent No.: US 8,598,969 B1
(45) Date of Patent: Dec. 3, 2013

(54) PCB-BASED TUNERS FOR RF CAVITY FILTERS

(75) Inventors: Anders P. Walker, Marion, IA (US); Thomas J. Journot, Cedar Rapids, IA (US); Todd A. Freeman, Anamosa, IA (US); John C. Mather, Cedar Rapids, IA (US); Jonathan A. Lovseth, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 383 days.

(21) Appl. No.: 13/087,895

(22) Filed: Apr. 15, 2011

(51) Int. Cl.

| | |
|---|---|
| ***H01P 1/205*** | (2006.01) |
| ***H01P 1/208*** | (2006.01) |
| ***H01P 1/219*** | (2006.01) |
| ***H03J 3/02*** | (2006.01) |
| ***H02N 2/04*** | (2006.01) |
| ***H03H 5/12*** | (2006.01) |
| *H01P 7/04* | (2006.01) |
| *H01P 7/06* | (2006.01) |
| *H03J 3/20* | (2006.01) |
| *H03J 3/26* | (2006.01) |

(52) U.S. Cl.
USPC ........... 333/209; 333/210; 333/224; 333/232; 333/233; 334/14; 334/44; 334/80; 310/323.01; 310/323.17

(58) Field of Classification Search
USPC ................. 333/209, 210, 212, 223, 224, 227, 333/231–233, 186, 188; 334/39, 14, 16, 44, 334/46, 80, 85; 310/323.01, 323.17
See application file for complete search history.

(56) References Cited

U.S. PATENT DOCUMENTS

| | | | | |
|---|---|---|---|---|
| 4,143,378 | A * | 3/1979 | Darrouzet | 342/368 |
| 4,692,727 | A * | 9/1987 | Wakino et al. | 333/219.1 |
| 5,552,210 | A * | 9/1996 | Horn et al. | 428/209 |
| 7,463,121 | B2 * | 12/2008 | D'Ostilio | 333/223 |
| 7,728,701 | B2 * | 6/2010 | Lin et al. | 333/209 |
| 8,362,853 | B2 * | 1/2013 | Park | 333/186 |
| 2008/0129422 | A1 * | 6/2008 | Alford et al. | 333/209 |
| 2008/0252401 | A1 * | 10/2008 | Margomenos et al. | 333/210 |
| 2010/0007442 | A1 * | 1/2010 | Narhi | 333/188 |
| 2010/0321132 | A1 * | 12/2010 | Park | 333/186 |
| 2011/0241802 | A1 * | 10/2011 | Joshi et al. | 333/209 |

FOREIGN PATENT DOCUMENTS

| | | | |
|---|---|---|---|
| WO | WO 2009/000862 | A2 * | 12/2008 |
| WO | WO 2010/040119 | A1 * | 4/2010 |

OTHER PUBLICATIONS

H. Joshi et al.; "Highly Loaded Evanescent Cavities for Widely Tunable High-Q Filters"; 2007 IEEE/MTT-S International Microwave Symposium, Jun. 3-8, 2007, pp. 2133-2136.*
S. Moon et al.; "Substrate Integrated Evanescent-Mode Cavity Filter With a 3.5 to 1 Tuning Ratio"; IEEE Microwave and Wireless Components Letters, vol. 20, No. 8, Aug. 2010, pp. 450-452.*

(Continued)

*Primary Examiner* — Barbara Summons
(74) *Attorney, Agent, or Firm* — Donna P. Suchy; Daniel M. Barbieri

(57) ABSTRACT

The present invention is directed to a piezo-electrically actuated membrane (ex.—a tuner) configured for use with a tunable cavity filter. The piezo-electrically actuated tuner may be formed of printed circuit board materials and may be placed over the cavities of the tunable cavity filter. Further, the piezo-electrically actuated tuner may promote high level performance of the tunable cavity filter, while allowing the tunable cavity filter to be tunable across wide bands.

19 Claims, 3 Drawing Sheets

(56) References Cited

OTHER PUBLICATIONS

S. Hajela et al.; "Widely Tunable High-Q Evanescent-Mode Resonators Using Flexible Polymer Substrates"; 2005 IEEE MTT-S International Microwave Symposium Digest, Jun. 12-17, 2005, pp. 2139-2142.*

J-F. Liang et al.; "Dual-Mode Dielectric or Air-Filled Rectangular Waveguide Filters"; IEEE Transactions on Microwave Theory and Techniques, vol. 42, No. 7, Jul. 2994, pp. 1330-1336.*

* cited by examiner

PCB-BASED TUNERS FOR RF CAVITY FILTERS

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N00173-06-C-2055 awarded by the Defense Advanced Research Projects Agency (DARPA).

FIELD OF THE INVENTION

The present invention relates to the field of electronic filters and particularly to Printed Circuit Board (PCB)-based tuners for Radio Frequency (RF) cavity filters.

BACKGROUND OF THE INVENTION

A number of electronic filter solutions are currently available for use with radio products, such as for use with Software-Defined Radio (SDR) systems. However, the currently available filter solutions may not provide a desired level of performance with respect to rejection, insertion loss, and/or power handling.

Thus, it would be desirable to provide a filter solution which obviates the problems associated with currently available filter solutions.

SUMMARY OF THE INVENTION

Accordingly, an embodiment of the present invention is directed to a tuner, including: a first cladding layer (ex.—a first copper cladding layer); a polymer layer (ex.—a polyimide layer), the polymer layer being connected to the first cladding layer; a second cladding layer (ex.—a second copper cladding layer), the second cladding layer being connected to the polymer layer; a piezoelectric disk, the piezoelectric disk being connected to the second cladding layer via an adhesive layer; a rigid-flex printed circuit board layer, the rigid-flex printed circuit board layer including a first surface, the rigid-flex printed circuit board layer further including a second surface, the second surface being located generally opposite the first surface, the second surface of the rigid-flex printed circuit board layer being connected to the second cladding layer via an adhesive layer; and a metallization layer, the metallization layer being connected to the first surface of the rigid-flex printed circuit board layer, wherein the tuner is configured for being implemented with a cavity filter to adjust a center frequency of the cavity filter, the tuner configured for being piezo-electrically actuated, the first cladding layer of the tuner configured for being connected to the cavity filter, the tuner configured for at least substantially covering a cavity of the cavity filter.

A further embodiment of the present invention is directed to a filter assembly including: a cavity filter (exs.—an evanescent mode cavity filter, a Radio Frequency cavity filter), the cavity filter being a generally box-shaped structure having a first plate, a second plate (the second plate being located generally opposite the first plate) and a plurality of side walls (the plurality of side walls being connected to the first plate and second plate), wherein a cavity (exs.—a dielectrically-loaded cavity, an air-filled cavity) is formed through the first plate and extends longitudinally toward the second plate, the cavity filter further having a post, the post being located within the cavity, the post being connected to the second plate of the cavity filter and extending toward the first plate of the cavity filter (a poly-para-xylene material may be layered on a surface of the post); the filter assembly further includes: a tuner, the tuner being connected to the cavity filter, the tuner configured for adjusting a center frequency of the cavity filter, the tuner including: a first cladding layer (ex.—a first copper cladding layer); a polymer layer (ex.—a polyimide layer), the polymer layer being connected to the first cladding layer; a second cladding layer (ex.—a second copper cladding layer), the second cladding layer being connected to the polymer layer; a piezoelectric disk, the piezoelectric disk being connected to the second cladding layer via an adhesive layer; a rigid-flex printed circuit board layer, the rigid-flex printed circuit board layer including a first surface, the rigid-flex printed circuit board layer further including a second surface, the second surface being located generally opposite the first surface, the second surface of the rigid-flex printed circuit board layer being connected to the second cladding layer via an adhesive layer; and a metallization layer, the metallization layer being connected to the first surface of the rigid-flex printed circuit board layer, the tuner configured for being piezo-electrically actuatable, thereby allowing for said tuner to be directed either towards the post or away from the post, based upon an electric field applied to the piezoelectric disk (the first cladding layer of the tuner is separated from the post by a gap), wherein the first cladding layer of the tuner is configured for being connected to the cavity filter, the tuner configured for at least partially covering a cavity of the cavity filter.

A still further embodiment of the present invention is directed to a Radio Frequency device, including: an antenna, the antenna being configured for at least one of receiving Radio Frequency signals and transmitting Radio Frequency signals; a cavity filter, the cavity filter being connected to the antenna, the cavity filter being configured for filtering the Radio Frequency signals; and a tuner, the tuner being connected to the cavity filter, the tuner configured for adjusting a center frequency of the cavity filter, the tuner being piezo-electrically actuatable, the tuner including: a first cladding layer; a polymer layer, the polymer layer being connected to the first cladding layer; a second cladding layer, the second cladding layer being connected to the polymer layer; and a piezoelectric disk, the piezoelectric disk being connected to the second cladding layer, wherein the first cladding layer of the tuner is configured for covering a cavity of the cavity filter.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1A:
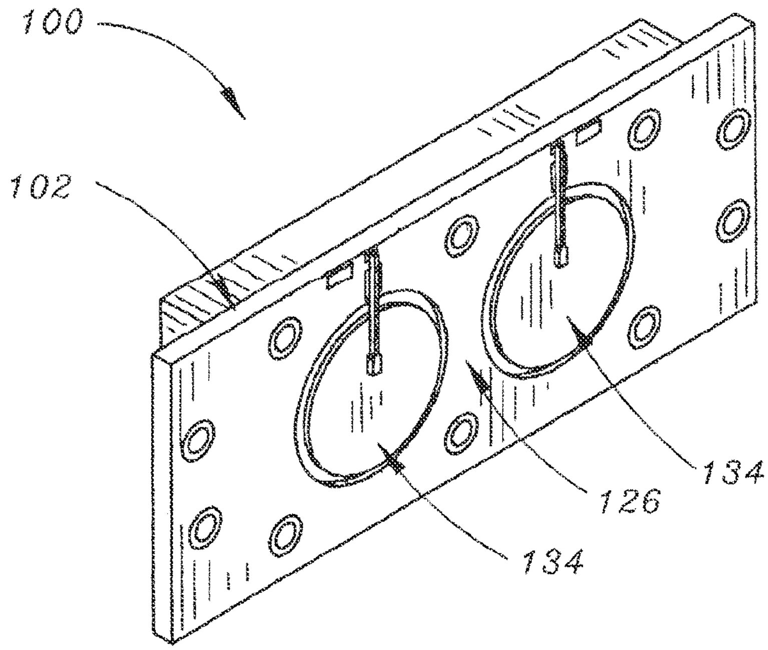
FIG. 1A is an isometric view of a filter assembly including a cavity filter and a PCB-based tuner in accordance with an exemplary embodiment of the present invention.

Reference will now be made in detail to the presently preferred embodiments of the invention, examples of which are illustrated in the accompanying drawings.

A wide variety of radio products are currently available. These currently available radio products are capable of operating over a wide range of frequencies and waveforms. A number of these currently available radio products are Software-Defined Radio (SDR) systems. These SDR systems attempt to support multiple current waveforms and frequency plans in a single programmable platform. In order to meet all of the requirements of these multiple supported waveforms, it would be desirable for filters of SDR systems to be capable of providing a highest available level of performance (ex.—high rejection and low insertion loss). Further, it would be desirable for filters of SDR systems to be tunable across wide frequency bands. Still further, it would be desirable for filters of SDR systems to be able to handle large power loads.

One filter solution which may be implemented in an attempt to provide the above-referenced characteristics involves the use of switched filter banks. Fixed lumped element or cavity filters may be designed to meet specs such as rejection, loss and power handling. These fixed filters are then grouped together and switch manifolds are used to pick the desired filter. However, in order to accommodate SDR, a large number of switched filter banks may need to be used. Further, lumped element filters tend to need tuning (ex.—for frequencies less than 1 Gigahertz). Still further, cavity banks often end up being very large (ex.—for frequencies greater than 1 GHz).

Another filter solution which may be implemented in an attempt to provide the above-referenced characteristics involves the use of varactor-tuned filter banks. The filters of the varactor-tuned filter banks may be designed with varactors as variable capacitances. Further, standard Printed Circuit Board (PCB) components and processes for providing said PCB components may be implemented in order to provide the varactor-tuned filter banks. However, power handling performance is generally very poor (ex.—very low) when implementing varactor-tuned filter banks. Further, Third Order Intercept Point (IP3) performance is generally very poor when implementing varactor-tuned filter banks.

Thus, currently available radio systems have filtering requirements that demand ever-increasing out-of-band rejection and lowest possible in-band insertion loss. Although cavity filters may provide very good performance, they are generally fixed frequency. The present invention provides a tuner which is configured for adjusting a center frequency of a high performance cavity filter (ex.—an evanescent mode cavity filter). The tuner of the present invention may allow for a tuning range (exs.—tuning bandwidth, Radio Frequency (RF) tuning range) of greater than one octave (ex.—1.0 to 1.7 octaves tuning range), may allow for a quality factor (Q) as high as 1400, and may, for instance, allow for bandwidths of 25 Megahertz (MHz) at 5 Gigahertz (GHz). Therefore, the present invention provides a filter solution which obviates the above-referenced shortcomings associated with currently implemented filter solutions.

Figure 1B:
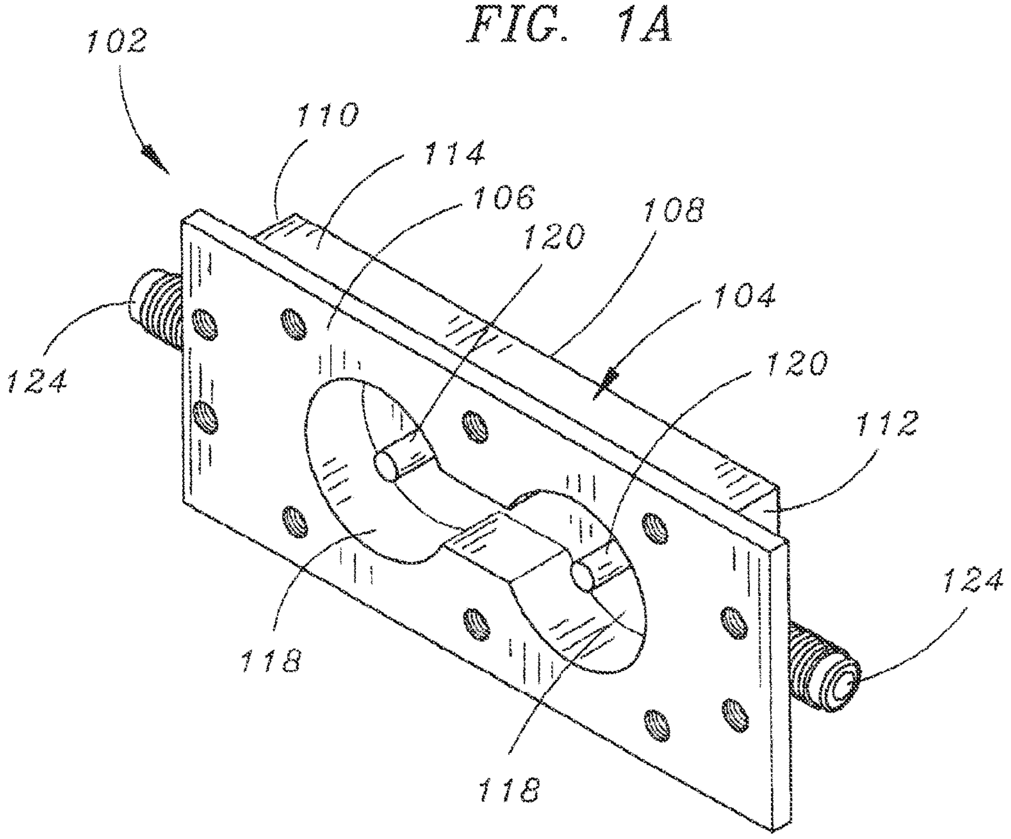
FIG. 1B is an isometric view of the cavity filter of the filter assembly of FIG. 1A.
Figure 2:
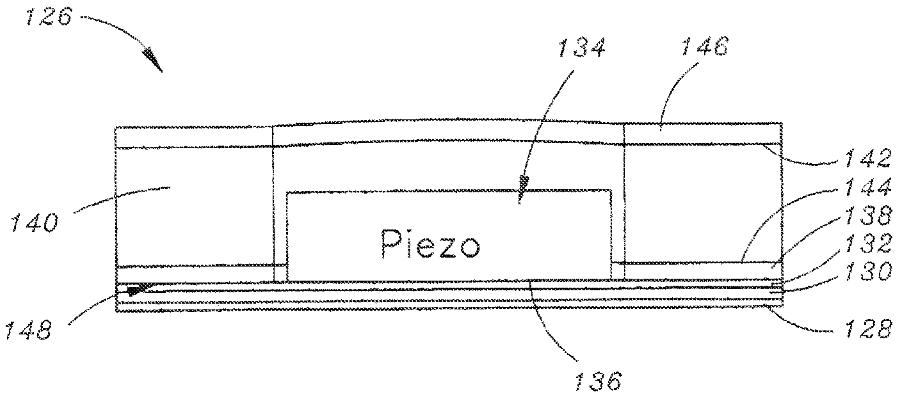
FIG. 2 is a partial cross-sectional view of the PCB-based tuner of the filter assembly of FIG. 1A in accordance with a further exemplary embodiment of the present invention.
Figure 3:
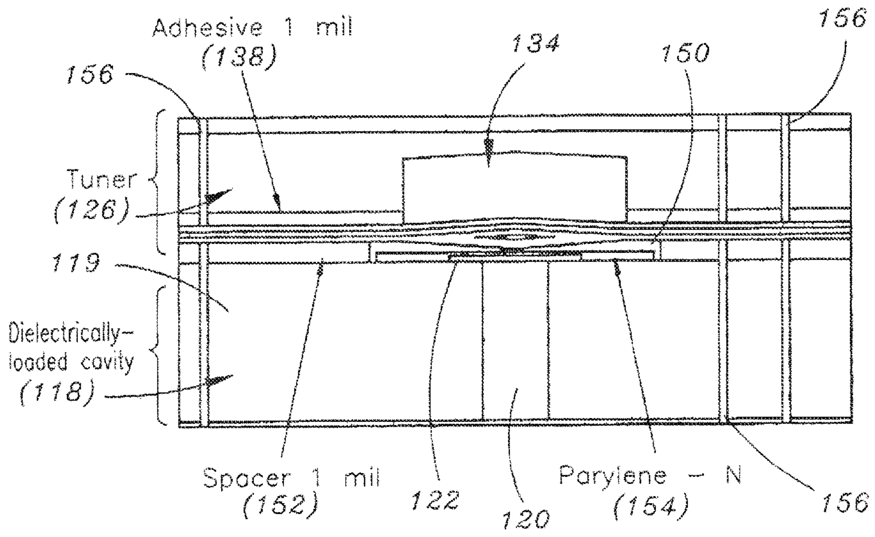
FIG. 3 is a partial cross-sectional view of the filter assembly of FIG. 1A in accordance with a further exemplary embodiment of the present invention.

Referring generally to FIGS. 1A, 2 and 3, a filter assembly 100 in accordance with an exemplary embodiment of the present disclosure is shown. In an exemplary embodiment of the present disclosure, the filter assembly 100 includes an electronic filter 102 (exs.—a Radio Frequency and microwave filter 102, a cavity filter 102). For example, the cavity filter 102 may be an evanescent mode cavity filter 102 (as shown in FIG. 1B). Further, the cavity filter 102 may be constructed of copper. In one or more embodiments, the cavity filter 102 may be configured for operating at or within a S-band frequency range. In the illustrated embodiment, the cavity filter 102 includes a generally box-shaped structure 104 having a top plate 106, a bottom plate 108, the bottom plate 108 being established generally opposite the top plate 106. The generally box-shaped structure 104 further includes four side walls (110, 112, 114, 116) which are connected to each other and also connect the top plate 106 to the bottom plate 108.

In further embodiments of the present disclosure, the generally box-shaped structure 104 of the cavity filter 102 includes one or more longitudinally extending recesses 118 (ex.—cavities 118) which are formed through the top plate 106 and extend toward the bottom plate 108. For instance, the cavities 118 formed by the enclosure 104 may be loaded with a dielectric material 119 (ex.—may be dielectrically-loaded cavities (as depicted in FIG. 3) or may be air-filled cavities 118 (as depicted in FIG. 1B)). In exemplary embodiments, the cavity filter 102 includes one or more posts 120 (exs.—rods 120, resonators 120), which are located within the one or more cavities 118 and are connected to (ex.—anchored to) the bottom plate 108 of the enclosure 104. Still further, the post(s) 120 may include top hat structure(s) 122. Further, the cavity filter 102 may include input/output (I/O) connectors 124, the I/O connector(s) 124 being connected to sidewalls (110, 112) of the generally box-shaped enclosure 104. The I/O connectors 124 may be configured for connecting the cavity filter 102 to (ex.—for allowing the cavity filter 102 to be inserted into) a transmission line.

In exemplary embodiments of the present disclosure, the filter assembly 100 further includes a tuner 126. The tuner 126 is configured for being connected to the cavity filter 102. In further embodiments of the present disclosure, the tuner 126 is configured for adjusting a center frequency of the cavity filter 102. For example, the tuner 126 may be stacked upon the top plate 106 of the cavity filter 102, such that the tuner 126 at least substantially covers the one or more cavities 118. In further embodiments of the present disclosure, the tuner 126 is at least partially constructed of printed circuit board (PCB) materials, such as standard PCB materials, rigid-flex PCB materials, flex circuit materials, flex print materials, and/or flex PCB materials. The tuner 126, as shown in FIGS. 2 and 3 may include a plurality of layers. In an exemplary embodiment of the present disclosure, the tuner 126 includes a first layer (ex.—a bottom layer) 128. For example, the first layer 128 may be formed of copper cladding. As mentioned above, the tuner 126 may be stacked upon the top plate 106 of the cavity filter 102, such that the first layer 128 of the tuner 126 at least substantially covers the one or more cavities 118.

In further embodiments of the present disclosure, the tuner 126 includes a second layer 130, which is connected to (exs.—located upon, stacked upon) the first layer 128. For instance, the second layer 130 may be formed of polyimide(s). In exemplary embodiments of the present disclosure, the tuner 126 includes a third layer 132, which is connected to (ex.—stacked upon) the second layer 130, such that the second layer 130 is located (ex.—sandwiched) between the first layer 128 and the third layer 132. For example, the third layer

132 may be formed of copper cladding. In further embodiments of the present disclosure, the tuner 126 includes one or more piezoelectric disks 134, which are configured for being connected to (ex.—bonded to) the third layer 132 (ex.—top copper cladding layer 132) via a first adhesive layer 136 (exs.—epoxy layer 136, glue layer 136, solder layer 136). For instance, the piezoelectric disk(s) 134 may be Commercial Off-the-Shelf Piezoelectric Transducer (COTS PZT) piezoelectric disks 134. Thirty micrometers travel (which is required for a 1 octave tuning range) may be generated using the COTS PZT piezoelectric disks 134. The first adhesive layer 136 (ex.—bond line) is controllable and uniform. For instance, the first adhesive layer 136 (ex.—bond line) may have a thickness of 1.960 mils.

In further embodiments of the present disclosure, the tuner 126 includes a second adhesive layer 138, which is bonded or connected to (ex.—placed upon or stacked upon) the third layer (ex.—top copper cladding layer 132). For instance, the second adhesive layer 138 may have a thickness of 1 mil. In still further embodiments of the present disclosure, the tuner 126 includes a PCB layer 140, the PCB layer 140 having a top surface 142 and a bottom surface 144, the bottom surface 144 established generally opposite the top surface 142. The PCB layer 140 may be connected to (exs.—adhered to, placed upon, stacked upon) the second adhesive layer 138, such that the second adhesive layer 138 is positioned between the third layer 132 (ex.—top copper cladding layer) and the PCB layer 140. For instance, the PCB layer 140 may be at least partially formed of and/or may be a FR4 stiffener (ex.—a glass reinforced epoxy laminate PCB material).

In exemplary embodiments of the present disclosure, the tuner 126 includes a metallization layer 146 (ex.—a top layer 146), which is connected to (ex.—formed upon) the top surface 142 of the PCB layer 140, the top surface 142 of the PCB layer 140 being oriented away from the cavity filter 102, the bottom surface 144 of the PCB layer 140 being oriented towards the cavity filter 102. For example, the metallization layer 146 may be formed of copper.

In further embodiments of the present disclosure, the first layer 128, second layer 130, third layer 132, first adhesive layer 136, second adhesive layer 138, PCB layer 140 and/or metallization layer 146 of the tuner 126 collectively form a tuning membrane 148 (ex.—a flexible tuning membrane 148). The tuning membrane 148 of the tuner 126 is a piezoelectrically-actuated tuning membrane 148. For example, an electrical field may be applied across the piezoelectric disk(s) 134, causing crystal lattice(s) of the disk(s) 134 to change shape, thereby causing the disk(s) 134 (which are connected (ex.—adhered) to the membrane 148) to direct the flexible tuning membrane 148 away from or towards the post(s) 120 based upon the applied electrical field. This movement of the membrane 148 away from or towards the post is the polyimide bow of the membrane 148. For the embodiments of the filter assembly 100 of the present disclosure, the polyimide bow of the membrane 148 may be as little as 8 micrometers. The herein described attachment of the disk(s) 134 to the membrane 148 contributes to this low amount of polyimide bow.

In exemplary embodiments of the filter assembly 100 of the present disclosure, the tuner 126 (ex.—the bottom layer 128 of the tuner 126) and top portion(s) 122 (ex.—top hat portion (s) 122) of the rod(s) 120 may be distanced apart from each other (ex.—separated from each other) by a gap 150.

In further embodiments of the present disclosure, the filter assembly 100 may include shims 152 (ex.—spacers 152) connected to the cavity filter 102, upon which the bottom layer 128 of the tuning membrane 148 may be at least partially supported, the shims 152 being configured for spacing the membrane 148 apart from the post(s) 120. For instance, the shims 152 may have a thickness of 1 mil. Further, the shims 152 may be constructed of metal. In still further embodiments of the present disclosure, a layer of insulating material 154 may be formed upon the post(s) 120. In further embodiments of the present disclosure, the insulating material may be a poly-para-xylene material, such as Parylene-N, and may be sputtered onto the post(s) 120. For example, the sputtered-on, insulating material layer 154 may have a thickness of two or more microns. Further, the insulating material layer 154 may increase the tuning range of the filter assembly 100 and may help to prevent shorting. In still further embodiments of the present disclosure, the tuner 126 and the cavity filter 102 may each have a plurality of conductive vias 156 formed therethrough, as shown in FIG. 3. In further embodiments of the present disclosure, the cavity filter 102 may implement an iris coupling and an air dielectric.

The piezoelectrically-actuated tuning membrane 148 described herein may enable the cavity filter 102 (ex.—tunable cavity filter 102) of the filter assembly 100 to provide a high level of performance (exs.—high quality (Q) factor, high rejection, low insertion loss, excellent return loss (RL)) and still be tunable across wide bands. For instance, the filter assembly 100 may provide frequency coverage from 1.0 Gigahertz (GHz) to 6.0 Gigahertz (GHz). The high linearity of the filter assembly 100, combined with its high out-of-band rejection allows for operation of the filter assembly 100 in strong emitter environments (ex.—such as during jamming) or in high co-site occupation situations. The filter assembly 100 may further provide low insertion loss, which may lead to low post-Power Amplifier (post-PA) transmit loss, which may enable the use of lower power amplifiers for handheld communication device applications. Absence of fly-back allows for multiple taps from the same RF node without interference. Further, the tuner 104 of present disclosure allows for the filter assembly 100 of the present disclosure to provide significant reduction in Size, Weight, Power and Cost (SWAP-C) compared with previous filter solutions, such as switched filter banks.

Figure 4:
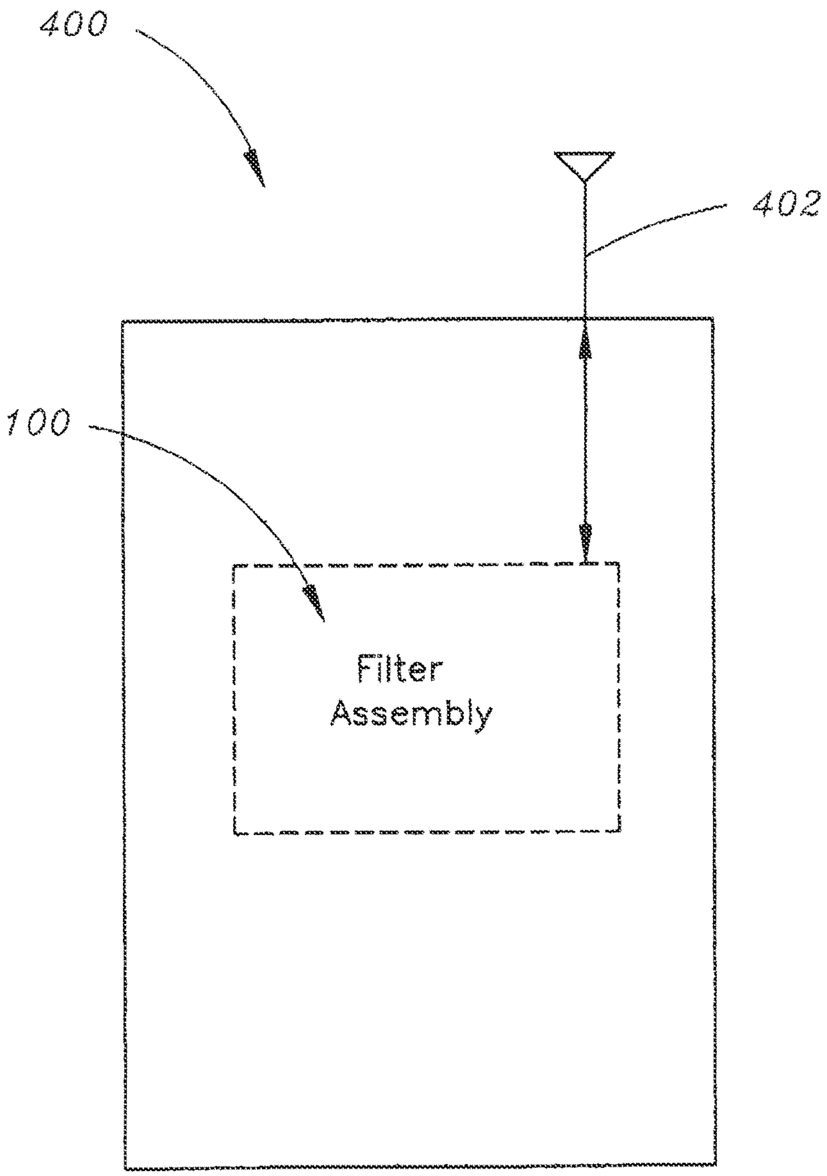
FIG. 4 is a block diagram schematic illustrating an RF device implementing the filter assembly of FIG. 1A in accordance with a further exemplary embodiment of the present invention.

In exemplary embodiments of the present disclosure, the filter assembly 100 may be implemented in high rejection, high frequency (ex.—greater than 1 GHz) front-end applications. In further embodiments of the present disclosure, the filter assembly 100 may be implemented in medium power (ex.—five Watt) transmitter applications. In still further embodiments of the present disclosure, the filter assembly 100 may be implemented in RF devices, such as man-portable radio devices and/or applications. For example, FIG. 4 illustrates the filter assembly 100 implemented in an RF device 400. The RF device 400 includes an antenna 402, the antenna being configured for receiving and/or transmitting RF signals, the filter assembly 100 being connected to the antenna 402. The cavity filter 102 of the filter assembly 100 being configured for filtering the transmitted and/or received RF signals. The tuner 126 of the filter assembly 100 is configured for adjusting a center frequency of the cavity filter 102.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A tuner, comprising:

a first cladding layer;

a polymer layer, the polymer layer being connected to the first cladding layer;

a second cladding layer, the second cladding layer being connected to the polymer layer;

a piezoelectric disk, the piezoelectric disk being connected to the second cladding layer; and a rigid-flex printed circuit board layer, the rigid-flex printed circuit board layer including a first surface, the rigid-flex printed circuit board layer further including a second surface, the second surface being located generally opposite the first surface, the second surface of the rigid-flex printed circuit board layer being connected to the second cladding layer, wherein the tuner is configured for being implemented with a cavity filter to adjust a center frequency of the cavity filter, the tuner configured for being piezo-electrically actuated, the first cladding layer of the tuner configured for being connected to the cavity filter, the tuner configured for at least substantially covering a cavity of the cavity filter.

2. A tuner as claimed in claim 1, further comprising:

a metallization layer, the metallization layer being connected to the first surface of the rigid-flex printed circuit board layer.

3. A tuner as claimed in claim 1, wherein the first cladding layer and the second cladding layer are each copper cladding layers.

4. A tuner as claimed in claim 1, wherein the polymer layer is formed of polyimide.

5. A tuner as claimed in claim 1, wherein the rigid-flex printed circuit board layer is connected to the second cladding layer via an adhesive layer.

6. A tuner as claimed in claim 1, wherein the piezoelectric disk is connected to the second cladding layer via an adhesive layer.

7. A filter assembly, comprising:

a cavity filter; and a tuner, the tuner being connected to the cavity filter, the tuner configured for adjusting a center frequency of the cavity filter, the tuner including:

a first cladding layer;

a polymer layer, the polymer layer being connected to the first cladding layer;

a second cladding layer, the second cladding layer being connected to the polymer layer;

a piezoelectric disk, the piezoelectric disk being connected to the second cladding layer; and a rigid-flex printed circuit board layer, the rigid-flex printed circuit board layer including a first surface, the rigid-flex printed circuit board layer further including a second surface, the second surface being located generally opposite the first surface, the second surface of the rigid-flex printed circuit board layer being connected to the second cladding layer, wherein the first cladding layer of the tuner is configured for at least partially covering a cavity of the cavity filter.

8. A filter assembly as claimed in claim 7, wherein the cavity filter is a Radio Frequency cavity filter.

9. A filter assembly as claimed in claim 7, wherein the cavity filter is an evanescent mode cavity filter.

10. A filter assembly as claimed in claim 7, wherein the cavity filter is a generally box-shaped structure including: a first plate; a second plate, the second plate being located generally opposite the first plate; and a plurality of side walls, the plurality of side walls being connected to the first plate and second plate.

11. A filter assembly as claimed in claim 10, wherein the cavity is formed through the first plate and extends longitudinally toward the second plate.

12. A filter assembly as claimed in claim 11, wherein the cavity is one of: a dielectrically-loaded cavity; and an air-filled cavity.

13. A filter assembly as claimed in claim 11, wherein the cavity filter further includes: a post, the post being located within the cavity, the post being connected to the second plate of the cavity filter and extending toward the first plate of the cavity filter.

14. A filter assembly as claimed in claim 13, wherein the first cladding layer of the tuner is separated from the post by a gap.

15. A filter assembly as claimed in claim 14, wherein the tuner is piezo-electrically actuatable, thereby allowing for said tuner to be directed either towards the post or away from the post, based upon an electric field applied to the piezoelectric disk.

16. A filter assembly as claimed in claim 13, wherein a poly-para-xylene material is layered on a surface of the post.

17. A Radio Frequency device, comprising:

an antenna, the antenna being configured for at least one of receiving Radio Frequency signals and transmitting Radio Frequency signals;

a cavity filter, the cavity filter being connected to the antenna, the cavity filter being configured for filtering the Radio Frequency signals; and a tuner, the tuner being connected to the cavity filter, the tuner configured for adjusting a center frequency of the cavity filter, the tuner including:

a first cladding layer;

a polymer layer, the polymer layer being connected to the first cladding layer;

a second cladding layer, the second cladding layer being connected to the polymer layer;

a piezoelectric disk, the piezoelectric disk being connected to the second cladding layer; and a rigid-flex printed circuit board layer, the rigid-flex printed circuit board layer including a first surface, the rigid-flex printed circuit board layer further including a second surface, the second surface being located generally opposite the first surface, the second surface of the rigid-flex printed circuit board layer being connected to the second cladding layer, wherein the first cladding layer of the tuner is configured for covering a cavity of the cavity filter.

18. A Radio Frequency device as claimed in claim 17, wherein the cavity filter further includes: a first plate; a second plate, the second plate being located generally opposite the first plate; a plurality of side walls, the plurality of side walls being connected to the first plate and second plate and a post, the post being located within the cavity, the post being connected to the second plate of the cavity filter and extending toward the first plate of the cavity filter, the post being separated from the first cladding layer of the tuner by a gap.

19. A Radio Frequency device as claimed in claim 18, wherein the tuner is piezo-electrically actuatable, thereby allowing for said tuner to be directed either towards the post or away from the post, based upon an electric field applied to the piezoelectric disk.

* * * * *